(12) United States Patent
Huang et al.

(10) Patent No.: US 8,952,670 B2
(45) Date of Patent: Feb. 10, 2015

(54) EFFICIENCY IMPROVEMENT OF A DRIVER BY USING SERIALLY CONNECTED LOW VOLTAGE TRANSISTORS OR DYNAMIC TRANSISTOR SIZE CONTROL

(71) Applicant: Richtek Technology Corporation, Chupei (TW)

(72) Inventors: Tsung-Wei Huang, Jubei (TW);
Shui-Mu Lin, Taichung County (TW);
Chueh-Kuei Jan, Zhubei (TW);
Chien-Yuan Cheng, Taipei (TW)

(73) Assignee: Richtek Technology Corp., Chupei, Hsinchu (TW)

( * ) Notice: Subject to any disclaimer, the term of this patent is extended or adjusted under 35 U.S.C. 154(b) by 91 days.

(21) Appl. No.: 13/829,622

(22) Filed: Mar. 14, 2013

(65) Prior Publication Data

US 2013/0249514 A1      Sep. 26, 2013

(30) Foreign Application Priority Data

Mar. 22, 2012   (TW) .............................. 101109876 A (51) Int. Cl.
| | | |
|---|---|---|
| *G05F 1/00* | (2006.01) | |
| *G05F 1/571* | (2006.01) | |
| *H02M 3/158* | (2006.01) | |
| *H03K 17/10* | (2006.01) | |
| *H03K 17/12* | (2006.01) | |

(52) U.S. Cl.
CPC ............ *H02M 3/1582* (2013.01); *H02M 3/158* (2013.01); *H03K 17/102* (2013.01); *H03K 17/122* (2013.01)
USPC .......................................... 323/282; 323/276

(58) Field of Classification Search
USPC .................. 323/222–225, 271–276, 282–285
See application file for complete search history.

(56) References Cited

U.S. PATENT DOCUMENTS

| | | | | |
|---|---|---|---|---|
| 6,018,450 | A  * | 1/2000 | Ahmad et al. .................. 361/90 |
| 7,233,131 | B2 * | 6/2007 | Lin et al. ........................ 323/268 |
| 2005/0174152 | A1* | 8/2005 | Kushnarenko ................ 327/108 |
| 2005/0258811 | A1* | 11/2005 | Matsuo et al. ................ 323/282 |
| 2008/0278129 | A1* | 11/2008 | Shimizu ........................ 323/282 |
| 2010/0156496 | A1* | 6/2010 | Rana et al. .................... 327/306 |
| 2010/0283439 | A1* | 11/2010 | Singh et al. ................... 323/282 |
| 2011/0043176 | A1* | 2/2011 | Sohma ........................ 323/282 |
| 2012/0007572 | A1* | 1/2012 | Oddoart ....................... 323/282 |
| 2012/0025796 | A1* | 2/2012 | Kahn ........................... 323/272 |
| 2012/0229102 | A1* | 9/2012 | Burns et al. ................... 323/224 |
| 2012/0326680 | A1* | 12/2012 | Burns et al. ................... 323/224 |
| 2013/0200868 | A1* | 8/2013 | Knoedgen ..................... 323/282 |

* cited by examiner

*Primary Examiner* — Timothy J Dole
*Assistant Examiner* — Yusef Ahmed
(74) *Attorney, Agent, or Firm* — Muncy, Geissler, Olds & Lowe, P.C.

(57) ABSTRACT

Serially connected low voltage transistors are used to replace a high voltage transistor in a voltage conversion circuit for a driver, or parallel connected sub-transistors are used to establish a high voltage transistor having an effective size dynamically adjusted according to loading of the driver, to reduce switching loss and thereby improve the efficiency of the driver.

26 Claims, 7 Drawing Sheets

EFFICIENCY IMPROVEMENT OF A DRIVER BY USING SERIALLY CONNECTED LOW VOLTAGE TRANSISTORS OR DYNAMIC TRANSISTOR SIZE CONTROL

FIELD OF THE INVENTION

The present invention is related generally to a driver and, more particularly, to a voltage conversion circuit for a driver.

BACKGROUND OF THE INVENTION

Figure 1:
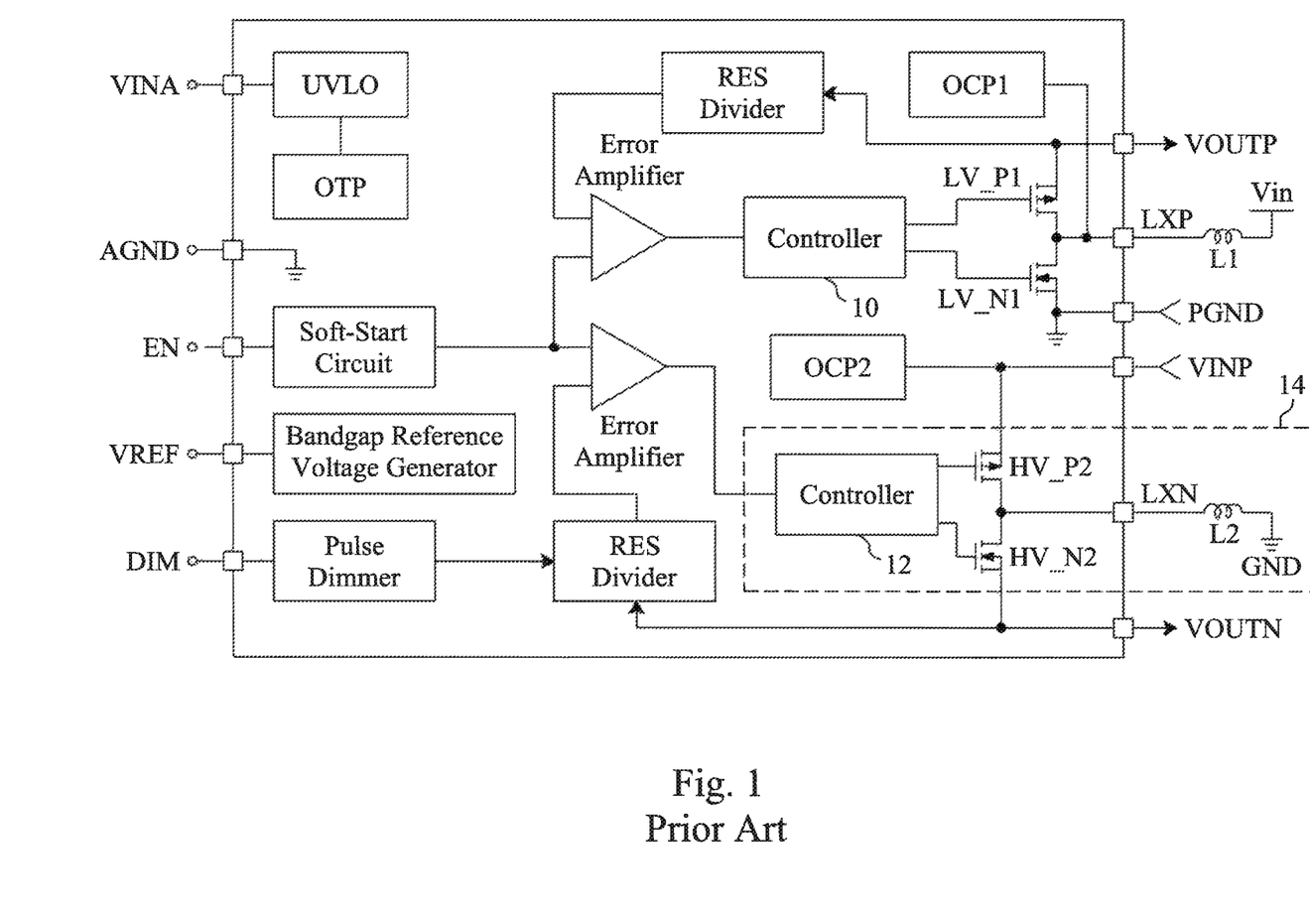
FIG. 1 shows a conventional driver for an AMOLED panel.
Figure 2:
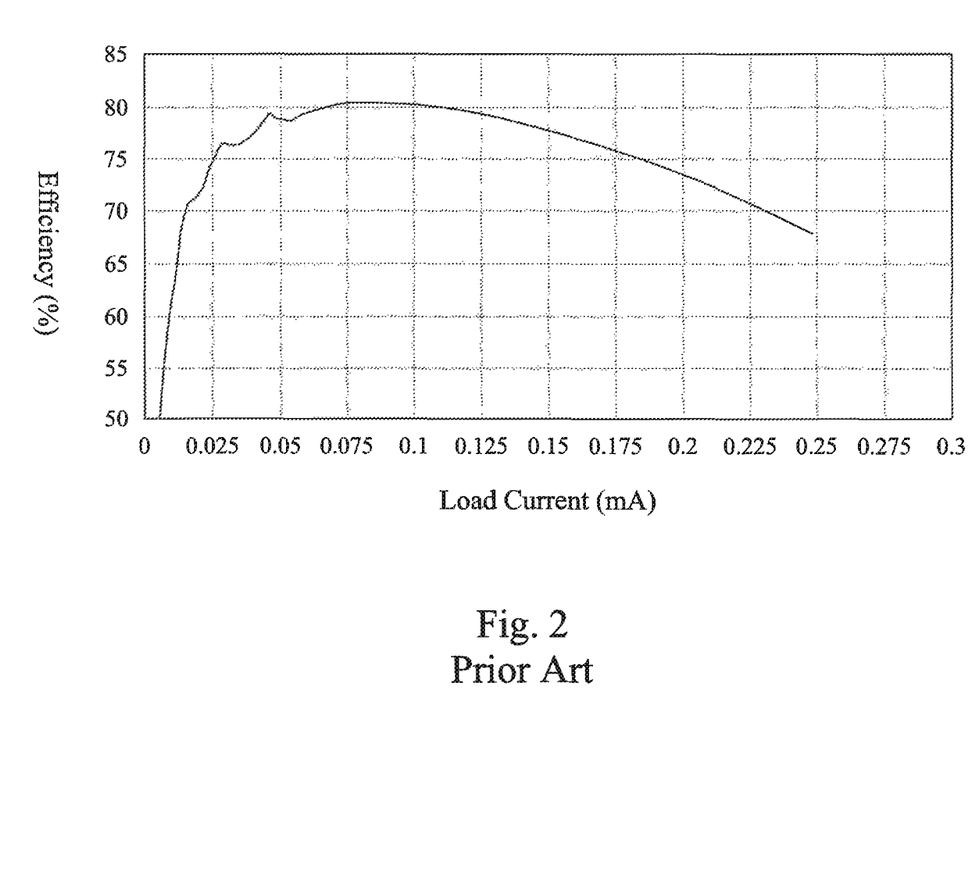
FIG. 2 shows an efficiency curve of the driver shown in FIG. 1 for negative voltage conversion.

Switching regulators have been widely applied in various power supplies and drivers, to convert an input voltage to a regulated output voltages by switching one or more power switches. For example, FIG. 1 shows a driver for providing a positive voltage VOUTP and a negative voltage VOUTN for driving an active matrix organic light emitting diode (AMOLED) panel, in which a transistor LV_P1 is connected between a positive voltage output terminal VOUTP and a switching node LXP, a transistor LV_N1 is connected between the switching node LXP and a voltage input terminal PGND, a controller 10 switches the transistors LV_P1 and LV_N1 to charge and discharge an inductor L1 connected between the switching node LXP and a voltage input terminal Vin to generate the positive output voltage VOUTP, a transistor HV_P2 is connected between a voltage input terminal VINP and a switching node LXN, a transistor HV_N2 is connected between the switching node LXN and a negative voltage output terminal VOUTN, and a controller 12 switches the transistors HV_P2 and HV_N2 to charge and discharge an inductor L2 connected between the switching node LXN and a ground terminal GND to generate the negative output voltage VOUTN, In this driver, the voltage conversion circuit 14 to generate the negative output voltage VOUTN operates to convert a positive input voltage VINP, e.g. 3.3V, to the negative output voltage VOUTN, e.g. −5.5V, and thus the transistors HV_P2 and HV_N2 will encounter high voltage thereacross during their operation, which requires use of high voltage transistors for the transistors HV_P2 and HV_N2. However, a high voltage transistor has larger parasitic capacitances between its gate and source and between its gate and drain, and thus the high voltage transistors HV_P2 and HV_N2 will bring significant switching loss and thereby result in worse efficiency of the driver, and more worse in light loading of the driver. FIG. 2 shows an efficiency curve of the driver shown in FIG. 1 for converting a positive input voltage VINP of 3.7V to a negative output voltage VOUTN of −5.5V, wherein the Y axis represents the percentage of the efficiency, and the X axis represents the load current which reflects the loading variation. As shown in FIG. 2, the maximum efficiency of the driver shown in FIG. 1 for the negative voltage conversion is only 80%.

Therefore, it is desired a circuit and a method for improving the efficiency of such type of drivers.

SUMMARY OF THE INVENTION

An objective of the present invention is to provide a voltage conversion circuit and a method for improving the efficiency of a driver.

According to the present invention, a voltage conversion circuit and a method for a driver use serially connected low voltage transistors to replace the conventional high voltage transistor in order to reduce the gate-source parasitic capacitance and the gate-drain parasitic capacitance, and thereby reduce the switching loss to improve the efficiency of the driver.

According to the present invention, a voltage conversion circuit and a method for a driver use parallel connected sub-transistors to establish a high voltage transistor to replace the conventional high voltage transistor, and dynamically adjust the effective size of the high voltage transistor to reduce the switching loss to improve the efficiency of the driver.

BRIEF DESCRIPTION OF THE DRAWINGS

These and other objectives, features and advantages of the present invention will become apparent to those skilled in the art upon consideration of the following description of the preferred embodiments of the present invention taken in conjunction with the accompanying drawings, in which.

DETAIL DESCRIPTION OF THE INVENTION

Figure 3:
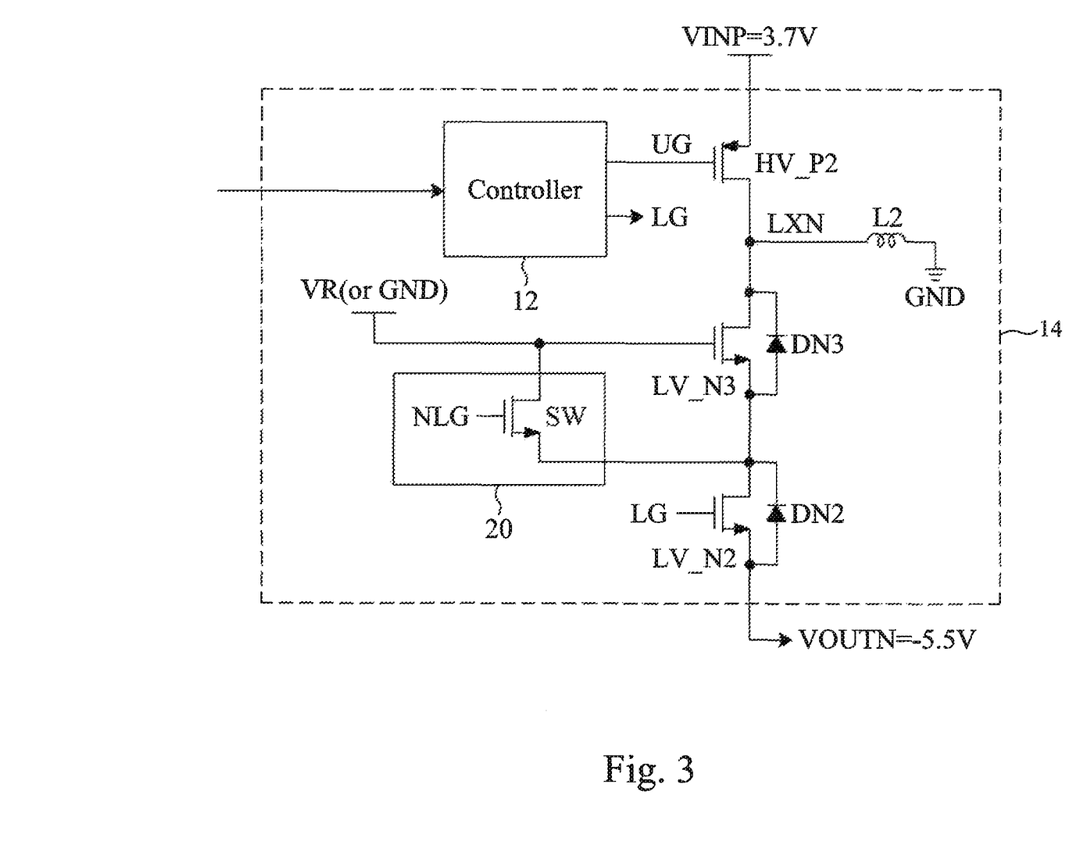
FIG. 3 is a circuit diagram of a first embodiment according to the present invention.

FIG. 3 is a circuit diagram of a first embodiment according to the present invention to replace the voltage conversion circuit 14 shown in FIG. 1, in which two serially connected low voltage transistors LV_N2 and LV_N3 replace the high voltage transistor HV_N2 shown in FIG. 1. In this embodiment, the low voltage transistor LV_N3 has its drain and source connected to the switching node LXN and the drain of the low voltage transistor LV_N2, respectively, and has its gate connected to a bias source VR or a ground terminal GND to keep the low voltage transistor LV_N3 on, the low voltage transistor LV_N2 has its source connected to the negative voltage output terminal VOUTN, diodes DN2 and DN3 represent the body diodes of the low voltage transistors LV_N2 and LV_N3, respectively, and the controller 12 provides signals UG and LG to switch the high voltage transistor HV_P2 and the low voltage transistor LV_N2, respectively, to thereby charge and discharge the inductor L2 connected between the switching node LXN and the ground terminal GND to generate the negative output voltage VOUTN, for example −5.5V. Preferably, there is further a protection circuit 20 connected between the bias source VR (or the ground terminal GND) and the source of the low voltage transistor LV_N3 in order to protect the low voltage transistor LV_N3. When the low voltage transistor LV_N2 is turned off, the source of the low voltage transistor LV_N3 will become floating, and the voltage at the source of the low voltage transistor LV_N3 may be the negative voltage VOUTN of −5.5V, leading to an over high voltage across the low voltage transistor LV_N3. For preventing this condition, when the low voltage transistor LV_N2 is off, the protection circuit 20 applies a predetermined voltage, e.g. VR or 0, to the source of the low voltage transistor LV_N3, thereby clamping the across voltage of the low voltage transistor LV_N3 under its withstanding threshold. In the embodiment of FIG. 3, the protection circuit 20 includes a switch SW connected between the bias source VR (or the ground terminal GND) and the source of the low voltage transistor LV_N3 and controlled by a signal NLG, which is an inversion of the signal LG.

In the embodiment of FIG. 3, the low voltage transistor LV _N3 may be regarded as a resistor when it is on, which provides the function of reducing the across voltage of the low voltage transistor LV_N2. More particularly, the serially connected low voltage transistors LV_N2 and LV_N3 divide the voltage between the switching node LXN and the negative voltage output terminal VOUTN, so the low voltage transistors LV_N2 and LV_N3 have their respective across voltages retained under their withstanding threshold. It is thus apparent that, in other embodiments, there may be more than two low voltage transistors connected in series between the switching node LXN and the negative voltage output terminal VOUTN, to further reduce the across voltage of each low voltage transistor.

In an integrated circuit, a high voltage transistor usually has a channel length at least twice as long as that of a low voltage transistor. In other words, a high voltage transistor has an area at least twice as large as that of a low voltage transistor. Thus, by using the two low voltage transistors LV_N2 and LV_N3 to replace the high voltage transistor HV_N2, the area of the circuit will not increase. In addition, the gate-source parasitic capacitance Cgs and the gate-drain parasitic capacitance Cgd of a transistor are approximately proportional to the channel length of the transistor. Therefore, the parasitic capacitances Cgs and Cgd of the high voltage transistor HV_N2 are at least twice as large as those of the low voltage transistor LV_N2 or LV_N3. In the embodiment of FIG. 3, since the low voltage transistor LV_N3 remains on, the parasitic capacitances Cgs and Cgd of the low voltage transistor LV_N3 do not cause switching loss; while the parasitic capacitances Cgs and Cgd of the low voltage transistor LV_N2 are smaller than half of those of the high voltage transistor HV_N2, the switching loss caused by the high voltage transistor HV_N2 is less than half of that caused by the high voltage transistor HV_N2. It is thus clear that using two low voltage transistors LV_N2 and LV_N3 to replace the high voltage transistor HV_N2 is helpful to improve efficiency of the driver.

In other embodiments, the low voltage transistor LV_N3 shown in FIG. 3 may be controlled by the signal LG. In this case, the low voltage transistors LV_N2 and LV_N3 are turned on and off together by the signal LG. Since the parasitic capacitances Cgs and Cgd of the high voltage transistor HV_N2 are at least twice as large as those of the low voltage transistor LV_N2 or LV_N3, the sum of the switching loss caused by the low voltage transistors LV_N2 and LV_N3 is still less than the switching loss caused by the high voltage transistor HV_N2.

Figure 4:
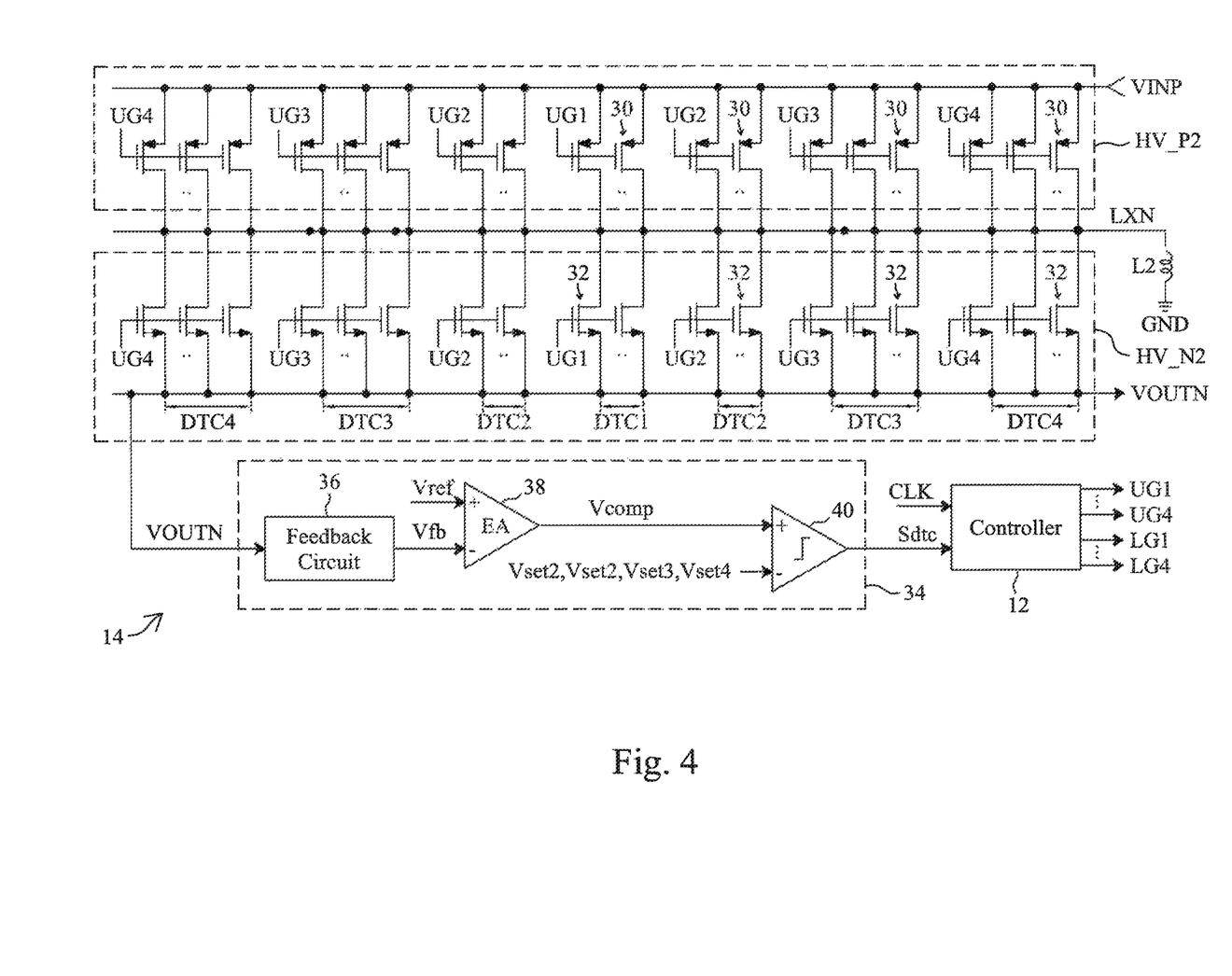
FIG. 4 is a circuit diagram of a second embodiment according to the present invention.

FIG. 4 is a circuit diagram of a second embodiment according to the present invention. Similar to the voltage conversion circuit 14 shown in FIG. 1, this embodiment also includes serially connected high voltage transistors HV_P2 and HV_N2. However, these two high voltage transistors HV_P2 and HV_N2 are established by a plurality of sub-transistors 30 connected in parallel and a plurality of sub-transistors 32 connected in parallel, respectively. In addition, a detector 34 is added between the negative voltage output terminal VOUTN and the controller 12, which monitors the loading of the driver to generate a dynamic transistor size control (DTC) signal Sdtc for the controller 12. In this embodiment, the area of the high voltage transistors HV_P2 and HV_N2 is approximately equal to that of the high voltage transistors HV_P2 and HV_N2 shown in FIG. 1, while the controller 12 shown in FIG. 4 is responsive to the DTC signal Sdtc to dynamically adjust the number of the sub-transistors 30 and 32 to be operated. In other words, the controller 12 dynamically adjusts the effective sizes of the high voltage transistors HV_P2 and HV_N2. The heavier loading of the driver is, the more sub-transistors 30 and 32 are operated, meaning that the effective sizes of the high voltage transistors HV_P2 and HV_N2 are larger. When the driver in lighter loading, fewer sub-transistors 30 and 32 are operated, meaning that the effective sizes of the high voltage transistors HV_P2 and HV_N2 are smaller, so the parasitic capacitance Cgs or Cgd are smaller and thus the switching loss is less. As illustrated, the dynamic transistor size control is useful to improve the overall efficiency of the driver.

In the embodiment of FIG. 4, the sub-transistors 30 and 32 are divided into four groups DTC1, DTC2, DTC3, and DTC4, and the controller 12 shown in FIG. 4 is slightly different from the controller 12 shown in FIG. 1. For dynamic transistor size control to the high voltage transistors HV_P2 and HV_N2, more paired signals (UG1,LG1), (UG2,LG2), (UG3,LG3), and (UG4,LG4) are generated according to the DTC signal Sdtc for controlling the groups DTC1, DTC2, DTC3, and DTC4, respectively. In the detector 34, a feedback circuit 36 monitors the negative output voltage VOUTN to generate a feedback voltage Vfb which is related to the loading of the driver, an error amplifier 38 amplifies the difference between the feedback voltage Vfb and a reference voltage Vref to generate an error signal Vcomp, a comparator 40 compares the error signal Vcomp with predetermined thresholds Vset1, Vset2, Vset3, and Vset4 to determine the DTC signal Sdtc, where Vset4>Vset3>Vset2>Vset1. The number of the predetermined thresholds for the comparator 40 is set by the system designer. In another embodiment, only one predetermined threshold Vset is used.

Referring to FIG. 4, when Vcomp<Vset1, the controller 12 does not trigger any of the switching signals (UG1,LG1), (UG2,LG2), (UG3,LG3), and (UG4,LG4), so all the groups DTC1, DTC2, DTC3, and DTC4 stay ineffective; when Vset1<Vcomp<Vset2, the controller 12 provides the signals UG1 and LG1 to drive the group DTC1; when Vset2<Vcomp<Vset3, the controller 12 provides the signals UG1, UG2, LG1, and LG2 to drive the groups DTC1 and DTC2; when Vset3<Vcomp<Vset4, the controller 12 provides the signals UG1-UG3 and LG1-LG3 to drive the groups DTC1-DTC3; and when Vcomp>Vset4, the controller 12 provides the signals UG1-UG4 and LG1-LG4 to drive the groups DTC1-DTC4. Responsive to increased loading of the driver, the error signal Vcomp increases, so more sub-transistors 30 and 32 are driven and switched to provide sufficient output current for the heavier loading. On the contrary, responsive to decreased loading of the driver, the error signal Vcomp decreases, and the current supplied by the fewer sub-transistors 30 and 32 is enough for the lighter loading.

Figure 5:
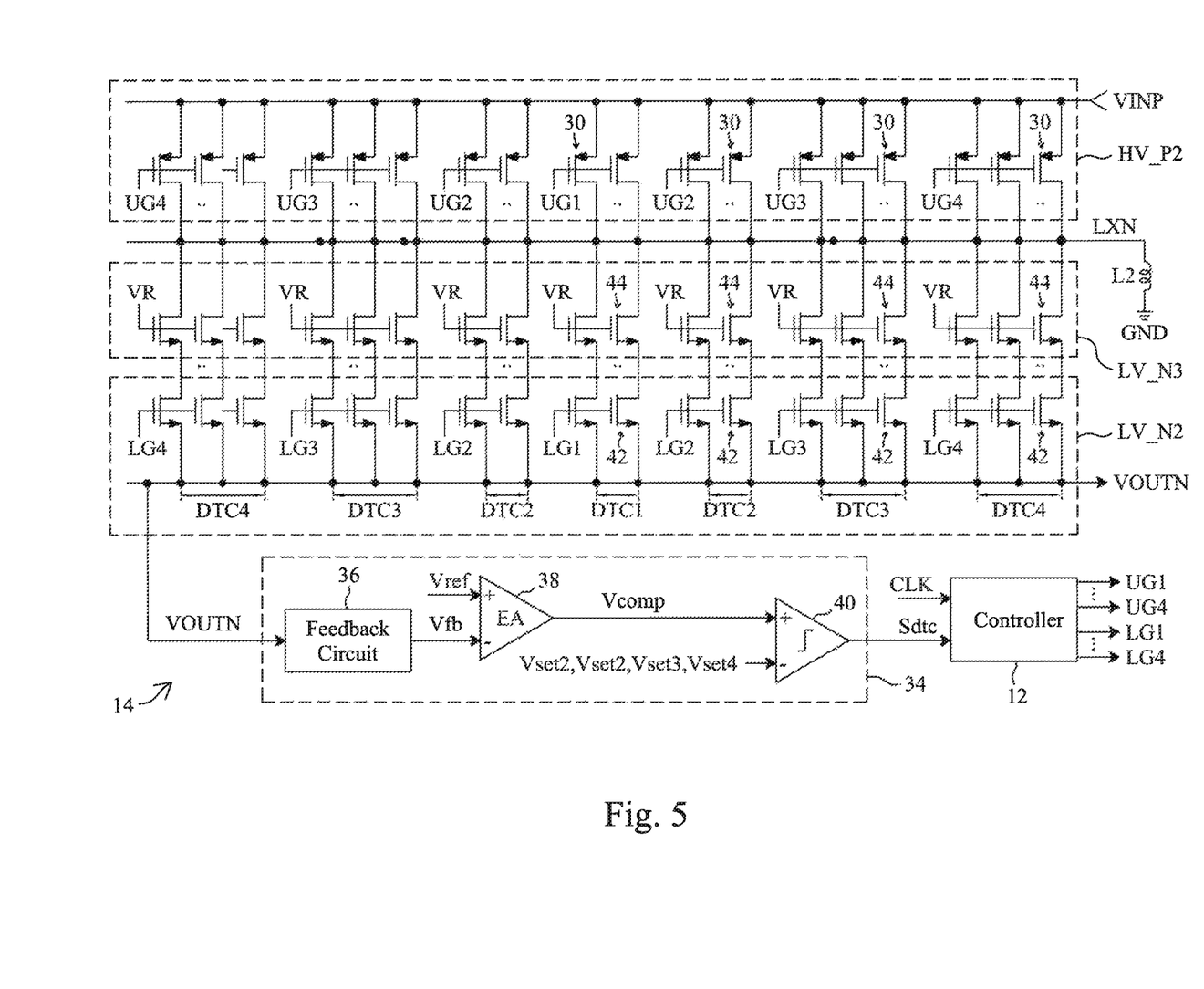
FIG. 5 is a circuit diagram of a third embodiment according to the present invention.

FIG. 5 is a circuit diagram of a third embodiment according to the present invention, which is obtained by applying dynamic transistor size control as shown in FIG. 4 to the voltage conversion circuit 14 shown in FIG. 3. In the embodiment of FIG. 5, in addition to the high voltage transistor HV_P2 includes a plurality of sub-transistors 30 connected in parallel, the low voltage transistors LV_N2 and LV_N3 also have a plurality of sub-transistors 42 and 44 connected in parallel, respectively. Similar to the embodiment of FIG. 4, the sub-transistors 30, 42, and 44 are divided into four groups DTC1, DTC2, DTC3, and DTC4, the detector 34 monitors the loading of the driver to generate the DTC signal Sdtc for the controller 12. Each of the sub-transistors 42 has its gate connected to a bias source VR, the controller 12 generates a plurality of paired signals (UG1,LG1), (UG2,LG2), (UG3, LG3), and (UG4,LG4) for controlling the sub-transistors 42 and 44 in the groups DTC1, DTC2, DTC3, and DTC4, respectively, to accomplish dynamic transistor size control to the high voltage transistors HV_P2 and the low voltage transistors LV_N2 and LV_N3. The embodiment of FIG. 5 may further include a protection circuit as the protection circuit 20 shown in FIG. 3 to protect the low voltage transistor LV_N3 from burning out. The dynamic transistor size control shown in FIG. 5 is operationally identical to that of FIG. 4.

Figure 6:
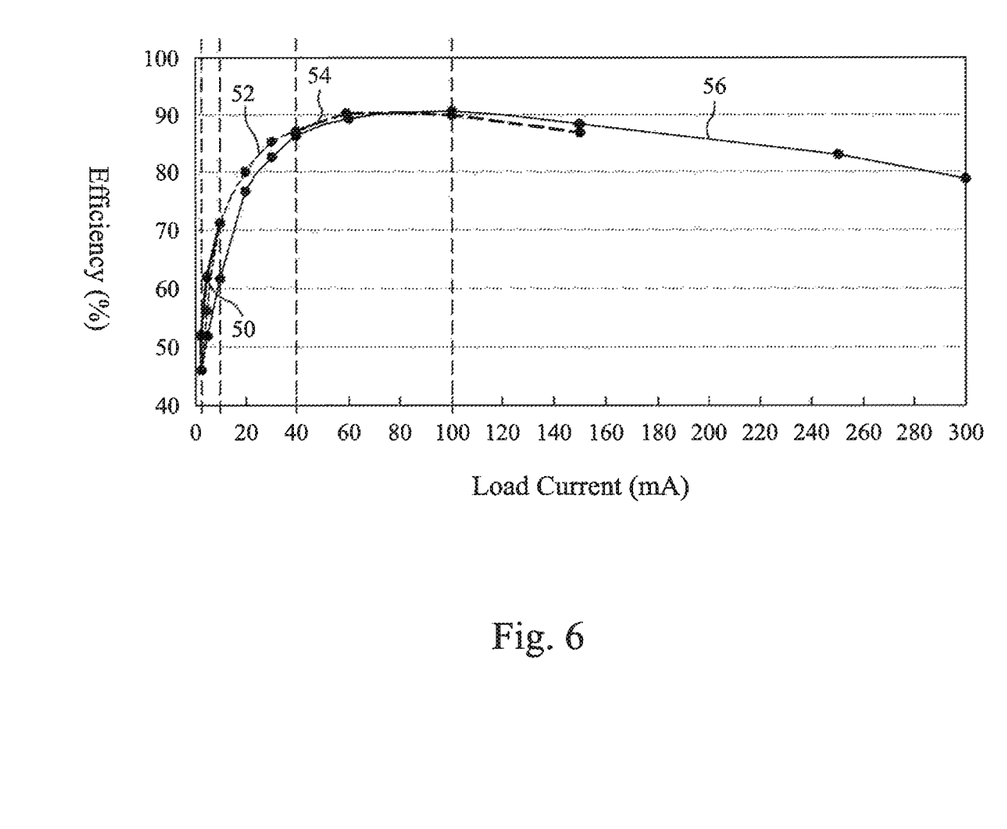
FIG. 6 shows simulated efficiency curves of the driver shown in FIG. 1 using the voltage conversion circuits of FIGS. 3 and 5.

When applying the voltage conversion circuit 14 shown in FIG. 5 to a driver as that shown in FIG. 1, it has efficiency curves as shown by the simulation result of FIG. 6, in which the curve 50 shows the efficiency when only the group DTC1 is driven, the curve 52 shows the efficiency when the groups DTC1 and DTC2 are driven, the curve 54 shows the efficiency when the groups DTC1-DTC3 are driven, and the curve 56 shows the efficiency when the groups DTC1-DTC4 are driven. As shown in FIG. 6, by using the voltage conversion circuit 14 of FIG. 5, the maximum efficiency of the driver can be increased by up to 90%, and in response to lighter loading of the driver, the sizes of the high voltage transistors HV_P2 and the low voltage transistors LV_N2 and LV_N3 are smaller, resulting in significant efficiency improvement. Since the curve 56 depicts the efficiency when all the groups DTC1-DTC4 are driven, it also depicts the efficiency when using the voltage conversion circuit 14 of FIG. 3. In other words, by using the voltage conversion circuit 14 of FIG. 3, the maximum efficiency of the driver can be also increased by up to 90%.

Figure 7:
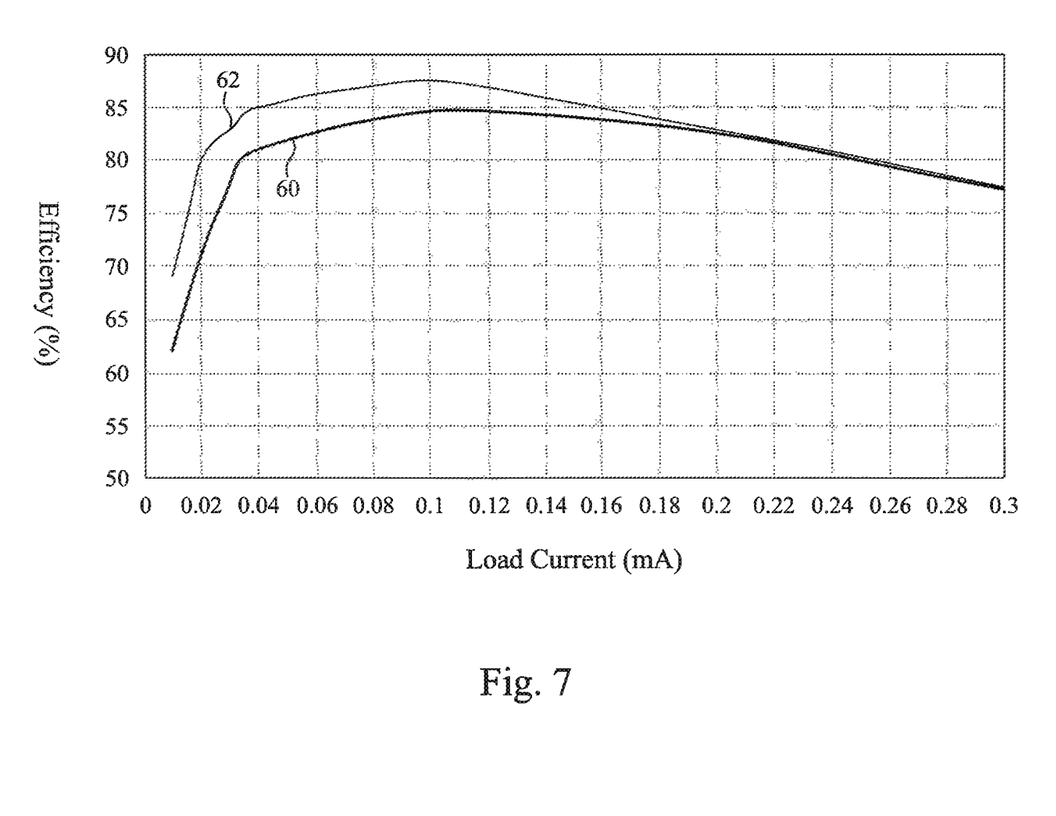
FIG. 7 shows simulated efficiency curves of the driver shown in FIG. 1 using the voltage conversion circuits of FIGS. 4 and 5.

When applying the voltage conversion circuits 14 shown in FIG. 4 and FIG. 5 to a driver as that shown in FIG. 1, the efficiency is as the simulated result shown by the curves 60 and 62 of FIG. 7. In the simulation, an equivalent resistance of the inductor L2 is added to the simulation parameters, and thus the efficiency shown in FIG. 7 is slightly lower than that shown in FIG. 6. As shown in FIG. 7, the maximum efficiency of the driver can be increased by up to 85% by using the voltage conversion circuit 14 of FIG. 4, and nearly 90% can be achieved by using the voltage conversion circuit 14 of FIG. 5. As shown by FIG. 6 and FIG. 7, the embodiments shown in FIG. 3, FIG. 4, and FIG. 5 are all useful to improve the efficiency of a driver as that shown in FIG. 1.

While the present invention has been described in conjunction with preferred embodiments thereof, it is evident that many alternatives, modifications and variations will be apparent to those skilled in the art. Accordingly, it is intended to embrace all such alternatives, modifications and variations that fall within the spirit and scope thereof as set forth in the appended claims.

What is claimed is:

1. A voltage conversion circuit for a driver having a voltage input terminal and a voltage output terminal to receive an input voltage and to provide an output voltage, respectively, the voltage conversion circuit comprising:
   a high voltage transistor connected between the voltage input terminal and a switching node;
   a first low voltage transistor and a second low voltage transistor connected in series between the switching node and the voltage output terminal;
   an inductor connected between the switching node and a ground terminal;
   a controller connected to the high voltage transistor and the second low voltage transistor, operative to provide a first signal and a second signal to switch the high voltage transistor and the second low voltage transistor, respectively, to thereby charge and discharge the inductor to generate the output voltage; and
   a protection circuit connected to an electrode of the first low voltage transistor that is connected to the second low voltage transistor, to apply a voltage to the electrode when the second low voltage transistor is off;
   wherein the first low voltage transistor is on when the second low voltage transistor is on;
   wherein the protection circuit comprises a switch connected between a bias source and the electrode and controlled by an inversion signal of the second signal.

2. The voltage conversion circuit of claim 1, wherein the first low voltage transistor has a control terminal connected to the bias source.

3. The voltage conversion circuit of claim 1, wherein the first low voltage transistor is off when the second low voltage transistor is off.

4. The voltage conversion circuit of claim 3, wherein the first low voltage transistor is controlled by the second signal.

5. A method for improving efficiency of a driver having a voltage input terminal to receive an input voltage, a high voltage transistor connected between the voltage input terminal and a switching node that is connected to an inductor, and a voltage output terminal to provide an output voltage, the method comprising the steps of:
   A.) connecting a first low voltage transistor and a second low voltage transistor in series between the switching node and the voltage output terminal;
   B.) providing a first signal and a second signal to switch the high voltage transistor and the second low voltage transistor, respectively, to charge and discharge the inductor to generate the output voltage;
   C.) keeping the first low voltage transistor on when the second low voltage transistor is on; and
   D.) applying a voltage to an electrode of the first low voltage transistor that is connected to the second low voltage transistor when the second low voltage transistor is off.

6. The method of claim 5, wherein the step C comprises applying a bias voltage to a control terminal of the first low voltage transistor.

7. The method of claim 5, wherein the step C comprises applying the second signal to a control terminal of the first low voltage transistor.

8. A voltage conversion circuit for a driver having a voltage input terminal and a voltage output terminal to receive an input voltage and to provide an output voltage, respectively, the voltage conversion circuit comprising:
   a first high voltage transistor established by a plurality of first sub-transistors connected in parallel between the voltage input terminal and a switching node;
   a second high voltage transistor established by a plurality of second sub-transistors connected in parallel between the switching node and the voltage output terminal;
   an inductor connected between the switching node and a ground terminal;
   a detector connected to the voltage output terminal, monitoring loading of the driver to generate a control signal; and
   a controller connected to the first high voltage transistor, the second high voltage transistor, and the detector, responsive to the control signal to provide a first set of signals and a second set of signals to switch a first number of the first high voltage transistor and a second number of the second high voltage transistor, respectively, to thereby charge and discharge the inductor to generate the output voltage;

wherein the first number and the second number are dynamically adjusted depending on the control signal;

wherein the first sub-transistors and the second sub-transistors are divided into a plurality of groups, and the controller is responsive to the control signal to determine a number of the groups to be switched by the first set of signals and the second set of signals.

9. The voltage conversion circuit of claim 8, wherein the detector comprises:
   a feedback circuit connected to the voltage output terminal, monitoring the output voltage to generate a feedback voltage which is related to the monitored loading of the driver;
   an error amplifier connected to the feedback circuit, amplifying a difference between the feedback voltage and a reference voltage to generate an error signal; and
   a comparator connected to the error amplifier, comparing the error signal with at least one predetermined threshold to determine the control signal.

10. A method for improving efficiency of a driver having a voltage input terminal to receive an input voltage, a first high voltage transistor connected between the voltage input terminal and a switching node that is connected to an inductor, a voltage output terminal to provide an output voltage, and a second high voltage transistor connected between the switching node and the voltage output terminal, the method comprising the steps of:
   A.) switching the first high voltage transistor and the second high voltage transistor to charge and discharge the inductor to generate the output voltage;
   B.) monitoring loading of the driver to generate a control signal; and
   C.) applying dynamic transistor size control to the first and second high voltage transistors according to the control signal;
   wherein the step C comprises the steps of:
   responsive to the control signal, selecting a first number of first sub-transistors connected in parallel to establish the first high voltage transistor; and
   responsive to the control signal, selecting a second number of second sub-transistors connected in parallel to establish the second high voltage transistor.

11. The method of claim 10, wherein the step B comprises the steps of:
   monitoring the output voltage to generate a feedback voltage which is related to the monitored loading of the driver;
   amplifying a difference between the feedback voltage and a reference voltage to generate an error signal; and
   comparing the error signal with at least one predetermined threshold to determine the control signal.

12. A voltage conversion circuit for a driver having a voltage input terminal and a voltage output terminal to receive an input voltage and to provide an output voltage, respectively, the voltage conversion circuit comprising:
   a high voltage transistor established by a first number of first sub-transistors connected in parallel between the voltage input terminal and a switching node;
   a first low voltage transistor and a second low voltage transistor connected in series between the switching node and the voltage output terminal, the first low voltage transistor established by a second number of second sub-transistors connected in parallel, the second low voltage transistor established by a third number of third sub-transistors connected in parallel;
   an inductor connected between the switching node and a ground terminal;
   a detector connected to the voltage output terminal, monitoring loading of the driver to generate a control signal; and
   a controller connected to the high voltage transistor, the second low voltage transistor, and the detector, responsive to the control signal to provide a first set of signals and a second set of signals to switch the high voltage transistor and the second low voltage transistor, respectively, to thereby charge and discharge the inductor to generate the output voltage;
   wherein the first number and the third number are dynamically adjusted depending on the control signal;
   wherein the first sub-transistors, the second sub-transistors, and the third sub-transistors are divided into a plurality of groups, and the controller is responsive to the control signal to determine a number of the groups to be switched by the first set of signals and the second set of signals.

13. The voltage conversion circuit of claim 12, wherein each of the second sub-transistors has a control terminal connected to a bias source.

14. The voltage conversion circuit of claim 12, wherein the second sub-transistors of one of the plurality of groups are on when the third sub-transistors belonging to that group are on.

15. The voltage conversion circuit of claim 12, wherein the second sub-transistors of one of the plurality of groups are off when the third sub-transistors belonging to that group are off.

16. The voltage conversion circuit of claim 12, wherein the second sub-transistors and the third sub-transistors in a same group are switched by a same one of the second set of signals.

17. The voltage conversion circuit of claim 12, further comprising a protection circuit connected to an electrode of the first low voltage transistor that is connected to the second low voltage transistor, operative to apply a voltage to the electrode when the second low voltage transistor is off.

18. The voltage conversion circuit of claim 17, wherein the protection circuit comprises a switch connected between a bias source and the electrode.

19. The voltage conversion circuit of claim 12, wherein the detector comprises:
   a feedback circuit connected to the voltage output terminal, monitoring the output voltage to generate a feedback voltage which is related to the monitored loading of the driver;
   an error amplifier connected to the feedback circuit, amplifying a difference between the feedback voltage and a reference voltage to generate an error signal; and
   a comparator connected to the error amplifier, comparing the error signal with at least one predetermined threshold to determine the control signal.

20. A method for improving efficiency of a driver having a voltage input terminal to receive an input voltage, a switching node connected to an inductor, and a voltage output terminal to provide an output voltage, the method comprising the steps of:
   A.) connecting a plurality of first sub-transistors in parallel to establish a high voltage transistor connected between the voltage input terminal and the switching node;
   B.) connecting a plurality of second sub-transistors in parallel to establish a first low voltage transistor;
   C.) connecting a plurality of third sub-transistors in parallel to establish a second low voltage transistor;
   D.) connecting the first low voltage transistor and the second low voltage transistor in series between the switching node and the voltage output terminal;

E.) switching the high voltage transistor and the second low voltage transistor to charge and discharge the inductor to generate the output voltage;
F.) monitoring loading of the driver to generate a control signal; and
G.) applying dynamic transistor size control to the high voltage transistor and the second low voltage transistor according to the control signal;
wherein the step G comprises the steps of:
dividing the plurality of first sub-transistors, the plurality of second sub-transistors, and the plurality of third sub-transistors into a plurality of groups; and
responsive to the control signal, determining a number of the groups to be switched in the step E.

21. The method of claim 20, wherein the step F comprises the steps of:
monitoring the output voltage to generate a feedback voltage which is related to the monitored loading of the driver;
amplifying a difference between the feedback voltage and a reference voltage to generate an error signal; and
comparing the error signal with at least one predetermined threshold to determine the control signal.

22. The method of claim 20, further comprising the step of applying a bias voltage to control terminals of a portion or all of the plurality of second sub-transistors.

23. The method of claim 20, further comprising the step of turning on the second sub-transistors of one of the plurality of groups when the third sub-transistors belonging to that group are on.

24. The method of claim 20, further comprising the step of turning off the second sub-transistors of one of the plurality of groups when the third sub-transistors belonging to that group are off.

25. The method of claim 20, further comprising the step of applying a same signal to switch the second sub-transistors and the third sub-transistors in a same group.

26. The method of claim 20, further comprising the step of applying a voltage to an electrode of the first low voltage transistor that is connected to the second low voltage transistor when the second low voltage transistor is off.

* * * * *